US006307369B1

(12) United States Patent
Felmlee et al.

(10) Patent No.: US 6,307,369 B1
(45) Date of Patent: Oct. 23, 2001

(54) AUTOCORRECTION OF 3D MR IMAGES FOR MOTION ARTIFACTS

(75) Inventors: Joel P. Felmlee; Kiaran P. McGee; Richard L. Ehman; Armando Manduca, all of Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 09/614,893

(22) Filed: Jul. 12, 2000

(51) Int. Cl.[7] ........................................... G01V 3/00
(52) U.S. Cl. ..................... 324/309; 324/307; 324/312
(58) Field of Search .................................. 324/309, 307, 324/300, 318, 312; 128/653

(56) References Cited

U.S. PATENT DOCUMENTS 5,729,140 * 3/1998 Kruger et al. .................... 324/309
6,184,682 * 2/2001 Ehman et al. .................... 324/309

FOREIGN PATENT DOCUMENTS

WO98/01828 1/1998 (WO) .

OTHER PUBLICATIONS

Autofocusing of Clinical Shoulder MR Images for Correction of Motion Artifacts, Mayo Clinic, Rochester MN, Manduca, et al.
Automatic Correction of Motion Artifacts in Magnetic Resonance Images Using an Entropy Focus Criterion, IEEE Transactions on Medical Imaging, vol. 16, No. 6, Dec. 1997, Atkinson, et al.
An Autofocus Algorithm for the Automatic Correction of Motion Artifacts in MR Images, Lecture Notes in Computer Science, 15th International Conference, IPMI '97, Atkinson, et al.
A Respiratory Motion Artifact Reduction Method In Magnetic Resonance Imaging of the Chest, IEEE Transactions on Medical Imaging, vol. 10, No. 1, Mar. 1991, Atalar, et al.
Motion Artifact Suppression: A Review of Post–Processing Techniques, MRI, vol. 10, pp 627–635, 1992, Hedley, et al.
Diffusion–Weighted Multiple Shot Echo Planar Imaging of Humans without Navigation, MRM 38 82–88 1997, Robson, et al.
MRI Artifact Cancellation Due to Rigid Motion in the Imaging Plane, IEEE Transactions on Medical Imaging, vol. 15, No. 6, Dec. 1996, Zoroofi, et al.
An Improved Algorithm for 2–D Translation Motion Artifact Correction, IEEE Transaction on Medical Imaging, vol. 10, No. 4, Dec. 1991, Hedley, et al.

* cited by examiner

Primary Examiner—Jay Patidar
Assistant Examiner—Brij B. Shrivastav
(74) Attorney, Agent, or Firm—Quarles & Brady, LLP

(57) ABSTRACT

A three-dimensional image data set is acquired with an MRI system and autocorrected to reduce artifacts caused by subject motion during image acquisition. Correction for motion along one or two axes is performed by selecting a 2D slice of data and autocorrecting it to produce phase corrections that are then made to the entire 3D image data set. This may be repeated by autocorrecting an additional 2D slice perpendicular to the first 2D slice to produce phase corrections for the 3D image data set for motion along the third axis.

9 Claims, 3 Drawing Sheets

AUTOCORRECTION OF 3D MR IMAGES FOR MOTION ARTIFACTS

BACKGROUND OF THE INVENTION

The field of the invention is nuclear magnetic resonance imaging methods and systems. More particularly, the invention relates to the correction of motion artifacts in 2D and 3D MR images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Object motion during the acquisition of NMR image data produces both blurring and "ghosts" in the phase-encoded direction. Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition.

Another proposed method for eliminating ghost artifacts is disclosed in U.S. Pat. No. 4,567,893, issued on Feb. 4, 1986. This prior patent teaches that the distance in the image between the ghosts and the object being imaged is maximized when the NMR pulse sequence repetition time is an odd multiple of one-fourth of the duration of the periodic signal variation. This can be used to alleviate ghosts due to respiratory motion. While this method, indeed, improves image quality, it does impose a constraint on the NMR pulse sequence repetition time and it often results in a longer total scan time. It also assumes that the motion is periodic.

Yet another method for reducing the undesirable effects due to periodic signal variations is disclosed in U.S. Pat. No. 4,706,026 issued on Nov. 10, 1987 and entitled "A Method For Reducing Image Artifacts Due To Periodic Variations In NMR Imaging." In one embodiment of this method, an assumption is made about the signal variation period (e.g. due, for example, to patient respiration) and the view order is altered from the usual monotonically increasing phase-encoding gradient to a preselected order. For a given signal variation period, a view order is chosen so as to make the NMR signal variation as a function of the phase-encoding amplitude be at a desired frequency. In one embodiment, the view order is selected such that the variation period appears to be equal to the total NMR scan time (low frequency) so that the ghost artifacts are brought as close to the object being imaged as possible. In another embodiment (high frequency), the view order is chosen to make the variation period appear to be as short as possible so as to push the ghost artifacts as far from the object as possible.

This prior method is effective in reducing artifacts, and is in some respects ideal if the variation is rather regular and at a known frequency. On the other hand, the method is not very robust if the assumption made about the motion temporal period does not hold (e.g., because the patient's breathing pattern changes or is irregular). If this occurs, the method loses some of its effectiveness because the focusing of the ghosts, either as close to the object or as far from the object as possible, becomes blurred. A solution to this problem is disclosed in U.S. Pat. No. 4,663,591 which is entitled "A Method For Reducing Image Artifacts Due To Periodic Signal Variations in NMR Imaging." In this method, the non-monotonic view order is determined as the scan is executed and is responsive to changes in the period so as to produce a desired relationship (low frequency or high frequency) between the signal variations and the gradient parameter. The effectiveness of this method, of course, depends upon the accuracy of the means used to sense the patient motion, and particularly, any variations in the periodicity of that motion.

Yet another method for reducing motion artifacts in NMR images is referred to in the art as "gradient moment nulling". This method requires the addition of gradient pulses to the pulse sequence which cancel, or null, the effect on the NMR signal phase caused by spins moving in the gradients employed for position encoding. Such a solution is disclosed, for example, in U.S. Pat. No. 4,731,583 entitled "Method For Reduction of NMR Image Artifacts Due To Flowing Nuclei By Gradient Moment Nulling".

The most successful method for correcting MR images for motion artifacts employs navigator signals acquired during the scan. As described in U.S. Pat. No. 4,937,526, such navigator signals are acquired periodically during the scan, and the information in these signals may be used to correct the image data for patient motion. Unfortunately, acquisition of the navigator signals increases the scan time.

An automatic correction method has been proposed by D. Atkinson et al., "Information Processing in Medical Imaging", P.341–354, 1997 in which the entropy of the reconstructed image is examined as a focus criterion by which to iteratively adjust motion estimate. This prior method, due to the properties of entropy, works mostly by making dark areas as dark as possible (thus removing ghosting), but does not use much information from the bright areas of the image. While this method works well on simple test images, clinical MR images often do not become as sharp as they should be and the processing time may be very long.

More recently, a retrospective algorithm, known as autocorrection, has been developed to reduce the influence of motion occurring during the image acquisition process. Using an iterative process, artifacts are quantitated by applying an image metric and a phase correction factor is determined that minimizes the metric value for the image. Such a method is disclosed in co-pending U.S. patent application Ser. No. 09/290,817 filed on Apr. 13, 1999. This and other similar methods attempt to reduce the influence of motion without an estimate of the magnitude or direction of the motion. An advantage of this process is that motion artifact reduction can be performed on all image data types, eliminating the need for specialized hardware, tailored pulse sequences, and theoretically the cooperation of the patient. However, each method has thus far been employed to correct artefacts in spin echo imaging or spin echo, echo planar imaging employing only two-dimensional (2D) acquisition sequences.

SUMMARY OF THE INVENTION

The present invention relates to the application of autocorrection methods to three-dimensional data sets. More particularly, a two-dimensional plane of data is selected from the 3D data set and autocorrected for motion along one or two axes in the plane. The phase correction produced by this autocorrection is applied to the entire 3D data set. Correction for motion along other axes is performed in a similar manner by extracting other 2D planes of data that contain the axes and calculating the phase corrections by the autocorrection method.

A general object of the invention is to correct a 3D MRI data set for motion along one or more axes using an autocorrection method. By extracting 2D planes and autocorrecting them to provide the phase corrections for the entire 3D MRI data set, the computation time is substantially reduced.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Figure 1:
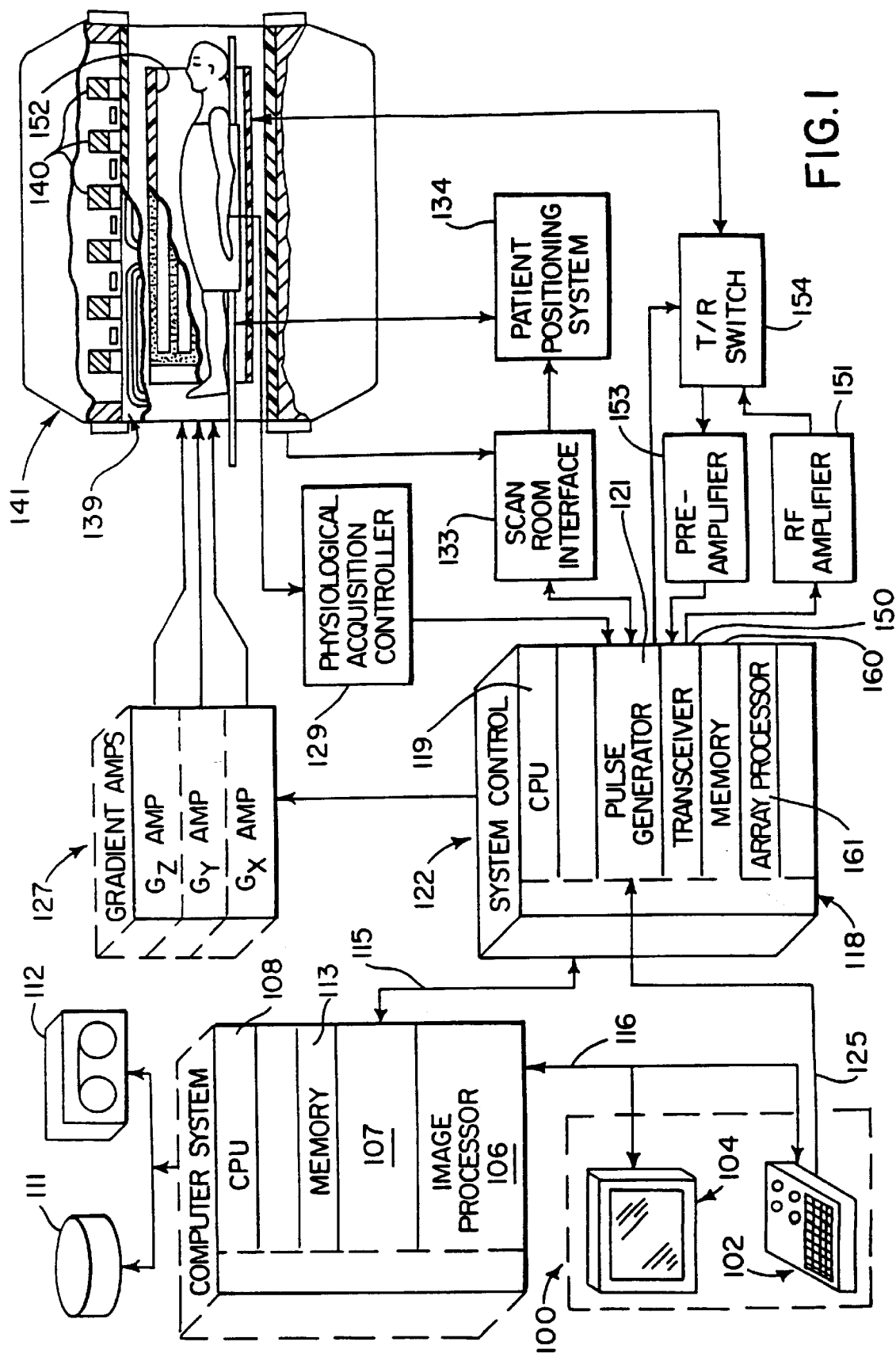
FIG. 1 is a block diagram of an MRI system which employs the present invention.

Data corruption due to global translational patient motion during the scan does not actually lose information. If the motion is known, and the appropriate phase corrections applied, the image can be perfectly restored. Rotational motion, while it can lose information, usually does not do so significantly. It is therefore possible in principle to correct for motion given only the raw data from the MR scanner by simply trying corrections for different possible assumed motions and searching for the highest quality resulting image with a suitable evaluation function.

Autocorrection is fundamentally different from prior methods in that it does not attempt to track patient motion (as do navigator echoes), nor does it seek information about the motion explicitly in the k-space data, as do some phase retrieval techniques. Rather, autocorrection performs motion correction by defining a measure or metric of image quality, and evaluating many combinations of possible patient motions, searching for a set which optimizes this quality after the corresponding corrections are made to the image. This is admittedly a computationally intensive process, and only the recent advent of high power processors makes such an approach feasible.

The motion is assumed to be inter-view, so that each line, or view, of k-space has an associated displacement, representing the position of the patient at the time the view was acquired. The set of these displacement values of all views is the motion history. The autocorrection method iteratively adjusts an estimate of the motion history, starting from an initial estimate of zero motion. For each estimate, the lines of k-space are corrected for the assumed motion by the appropriate phase shifts, the data is transformed to the image domain, and the quality of the image is evaluated. The estimate of patient motion is gradually refined to optimize the image quality. It is assumed that the metric has an optimal value if the object is stationary, and that any motion during the imaging sequence will corrupt the image and degrade this value. In other words, it is assumed that it is impossible to make an image better (both in terms of the metric and of visual quality) because of patient motion during the scan, and that the better the value of the metric, the better the visual quality of the image.

In mathematical terms, autocorrection casts motion correction as an optimization problem, with the metric as the cost function, in a very high-dimensional space of possible motion corrections (as many dimensions as there are views in the acquired data). It is very difficult to find the true global minimum of such a cost function. However, in practice, it is possible to search the space of possible solutions in a way which often yields very good improvements in image quality in a reasonable amount of time.

The autocorrection method iteratively adjusts an estimate of the motion history (the relative motion at the time each view was acquired), starting from an initial estimate of zero motion, and trying corrections for different possible motion histories and searching for the highest quality resulting image. As noted above, this is optimization in a very high dimensional space, since each view has its own associated relative motion.

Acquisition of a three-dimensional MR data set employs a pulse sequence which defines a single frequency and two phase encoding axes. Unless otherwise specified, the spatial domain equivalent axes x, y and z will be used to represent these three spatial frequency axes $k_x$, $k_y$ and $k_z$ respectively. Using nomenclature for bulk three dimensional motion, a phase rotation at the with sample of an echo at the jth and the kth phase encoding views is introduced according to:

$$\Delta\phi_c(i,j,k)=\Delta\phi_x(i)+\Delta\phi_y(j)+\Delta\phi_z(k)+\Delta\phi_p \qquad (1)$$

The first three terms of this equation assume view-to-view motion along the three spatial axes of x, y and z. The fourth term is added to account for intra-view effects which arise from motion during the echo time (TE) interval.

For 2D GRE acquisitions, the phase rotation term is reduced to:

$$\Delta\phi_c(i,j)=\Delta\phi_x(i)+\Delta\phi_y(j)+\Delta\phi_p \qquad (2)$$

Unlike adaptive motion correction schemes that employ navigator echoes to directly measure motion and apply a correction according to Eq. 1, autocorrection iteratively estimates the phase correction required to counteract the phase error caused by motion. Autocorrection for motion along a single phase encoding axis has been described previously. The method segments the image into contiguous blocks of echoes and estimates the motion occurring during the acquisition and calculates a phase rotation for all data points within the block according to:

$$\Delta\phi_y(j) = 2\pi\Delta y_j \left[ j - \left( \frac{N_y - 1}{2} \right) \right] \frac{1}{N_y} \quad (3)$$

Where $N_y$ is the number of phase increments along $k_y$, j is the view number, and $\Delta_{yj}$ is the estimate of the view-to-view motion at view j. Each block of echoes is processed sequentially and the process is repeated, reducing the block size by a factor of two, until a phase correction for each echo is estimated.

When motion occurs along the frequency-encoding axis, blocks of k-space data are selected and a phase correction is applied to each view. However, instead of a constant phase applied across the entire echo, a separate phase term for each data point in the echo must be applied according to:

$$\Delta\phi_x(i) = 2\pi\Delta x_j \left[ i - \left( \frac{N_x - 1}{2} \right) \right] \frac{1}{N_x} \quad (4)$$

Where $N_x$ is the number samples of the echo, i is the sample number and $\Delta x_j$ is the view-to-view motion along x for view j. Although the phase correction in Eq. (4) varies linearly across the echo sample points, all samples with the same spatial frequency within the block are corrected by the same amount.

For motion along the remaining z-axis, the phase correction becomes:

$$\Delta\phi_z(k) = 2\pi\Delta z_k \left[ k - \left( \frac{N_z - 1}{2} \right) \right] \frac{1}{N_z} \quad (5)$$

where k represents the kth phase offset along $k_z$ at the jth phase offset along $k_y$, and $N_z$ is the number of phase encodings along $k_z$. Autocorrection of motion along this axis is performed using the same technique as motion along $k_y$.

When motion occurs along multiple axes, autocorrection must estimate the separate terms in Eq. (1) dependent upon the axes along which motion occurs. For example, for motion in the x-y plane, autocorrection must estimate $\Delta\phi_x$, $\Delta\phi_y$, and $\Delta\phi_p$. For 2D GRE, only motion along the x and y axes can be resolved as z axis motion will cause magnitude changes in the transverse magnetization, $M_{xy}$. To autocorrect for x-y motion in 2D GRE, a separate term for $\Delta\phi_x$, $\Delta\phi_y$, and $\Delta\phi_p$ must be estimated. We employ a modified version of our original method that, for each block size estimates the value of $\Delta x$ and $\Delta y$ occurring during the acquisition. An estimate of $\Delta\phi_p$ is determined by the autocorrection algorithm when the block size of one (a single echo) is reached as part of the $\Delta y$ correction process.

When motion occurs along multiple axes, the complexity of autocorrection is correspondingly increased. If we consider a common 3D data set of 256 frequency, 128 phase, and 32 phase encoding terms ($k_x$, $k_y$, $k_z$), autocorrection must estimate greater than eight thousand phase rotation terms. To reduce this computational burden, the echo-ordering scheme employed in conventional 3D GRE sequences is utilized. In conventional acquisition view-ordering scheme image echoes are acquired at a fixed offset along the first phase encoding axis, $k_y$, while phase offsets along the second phase encoding axis, $k_z$, are incremented sequentially. After acquisition of these echoes, the phase offset in $k_y$ is incremented and the process is repeated until the entire data set is acquired. We assume that $\Delta z$ is constant for a fixed phase offset in $k_y$. This is true if the repetition rate (TR) of the acquisition sequence is short compared to the period of motion during imaging. Also, the z axis resolution is considerably less than the in-plane (x-y) resolution making this axis less sensitive to global motion. When these two conditions are met, the number of phase rotation factors to correct for motion in a 3D data set can be reduced.

In 3D GRE, when motion is constrained to the imaging volume, the separate phase corrections in Eq. (1) can be estimated. If motion occurs along two of the three axes, a hybrid plane of data containing these two dimensions can be extracted from the 3D data set. Hybrid data is obtained by performing an inverse Fourier transform along the axis in which motion was non-existent or minimal. For example, if motion occurred in the y-z pane, an inverse Fourier transform along $k_x$ will result in a hybrid data set containing spatial and spatial frequency coordinates of x, $k_y$ and $k_z$. Autocorrection is then performed on a x, $k_y$ and $k_z$ plane extracted from this data set. The phase correction map, $\Delta\phi_c(j,k)$, estimated from autocorrection is then applied to all $k_y$-$k_z$ planes within the data set. Inverse Fourier transformation along the remaining two spatial frequency axes provides the autocorrected 3D GRE data set.

Motion along the x-z axes is treated separately. Our experience shows that for this motion, extraction of separate hybrid planes and autocorrection for each motion independently was the most efficacious. To perform autocorrection in this instance, a hybrid $k_x$, $k_y$, z plane is extracted and autocorrected for motion along the frequency encoding axis only. The phase correction map is applied to the 3D k-space data and a second hybrid x, $k_y$, $k_z$ plane is extracted and autocorrected for motion along the z axis. The phase correction factor derived from this autocorrection is applied to the entire data set.

To autocorrect for simultaneous rectilinear motion along all three axes, a $k_x$, $k_y$, z plane is extracted from the 3D hybrid data set. Autocorrection is performed on this plane to estimate $\Delta\phi_c(i,j)$ and then applied to the hybrid data set. Autocorrection for motion along the remaining axis, z, is performed by extracting a hybrid plane x, $k_y$, $k_z$ and estimating the phase rotation map, $\Delta\phi_c(j,k)$. Although this scheme estimates motion along the y-axis twice, our experience to date has shown this to be more robust than estimating motion along the z axis only

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
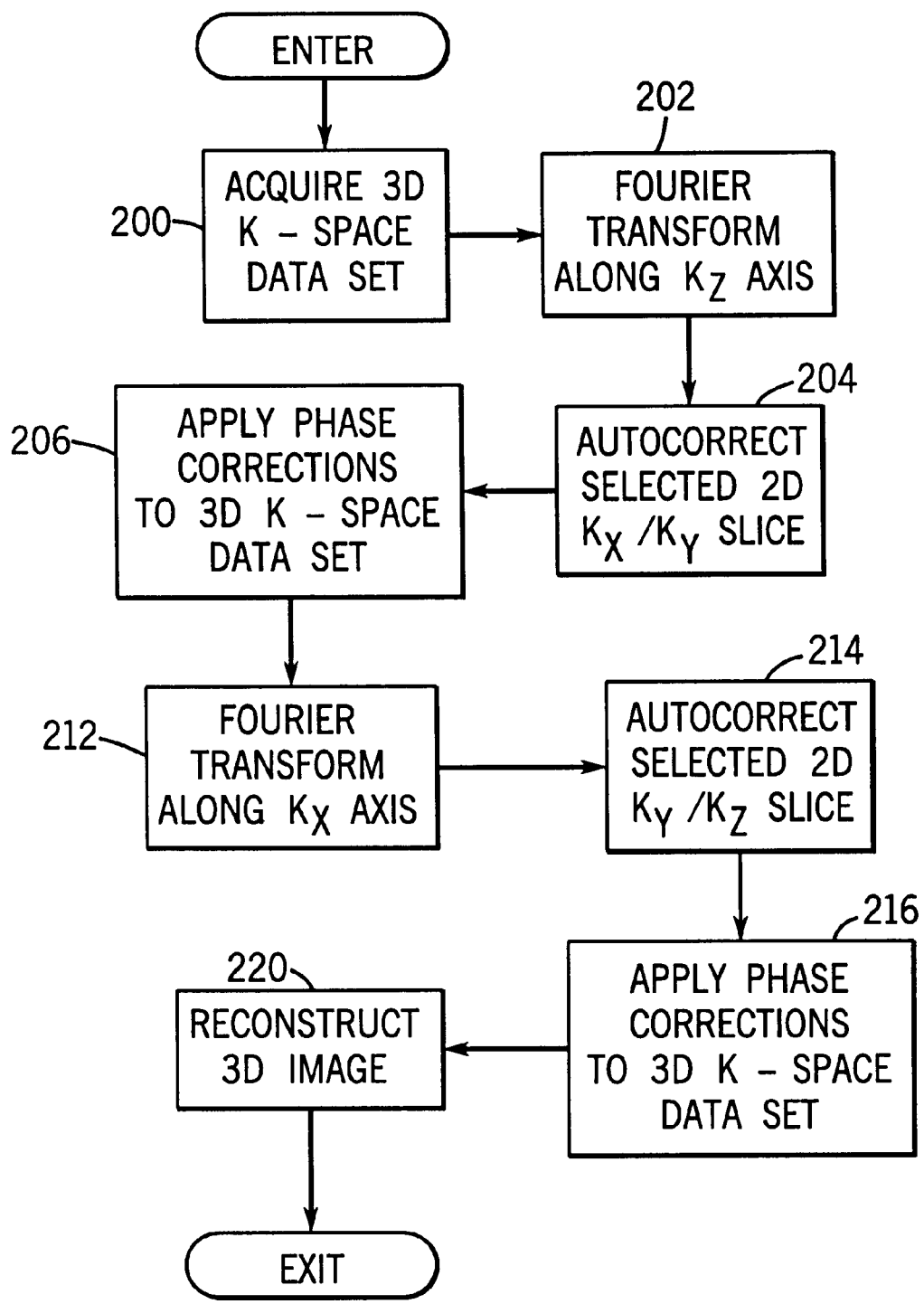
FIG. 2 is a flow chart of the preferred autocorrection method employed by the MRI system of FIG. 1.

Referring particularly to FIG. 2, to practice the present invention a three-dimensional imaging pulse sequence is performed by the MRI system to acquire a 3D k-space data set as indicated at process block 200. As explained below, a 3D gradient-recalled echo (GRE) pulse sequence is used in the preferred embodiment, although it can be appreciated that other pulse sequences may be employed.

The next step, as indicated by process block 202, is to perform a Fourier transform along the $k_z$ axis of a copy of the 3D k-space data set. A two-dimensional slice, or plane, of data is then selected from this "hybrid" 3D k-space data set and an autocorrection process indicated at block 204 is performed on it. This 2D plane is oriented perpendicular to the z-axis and contains $k_x$–$k_y$ k-space data which is phase corrected using the autocorrection method disclosed in co-pending International patent application Ser. No. PCT/US99/08123, filed on Apr. 14, 1999, and entitled "Autocorrection Of MR Images For Motion Artifacts." This method corrects for in-plane motion along two perpendicular axes, $k_x$ and $k_y$. Other known autocorrection methods discussed above can be used. The phase corrections which are made are also stored in a two-dimensional correction array 208 and at the completion of the autocorrection process, the sum of the phase corrections for each sample in the $k_x$–$k_y$ plane are stored in this correction array 208.

Figure 3:
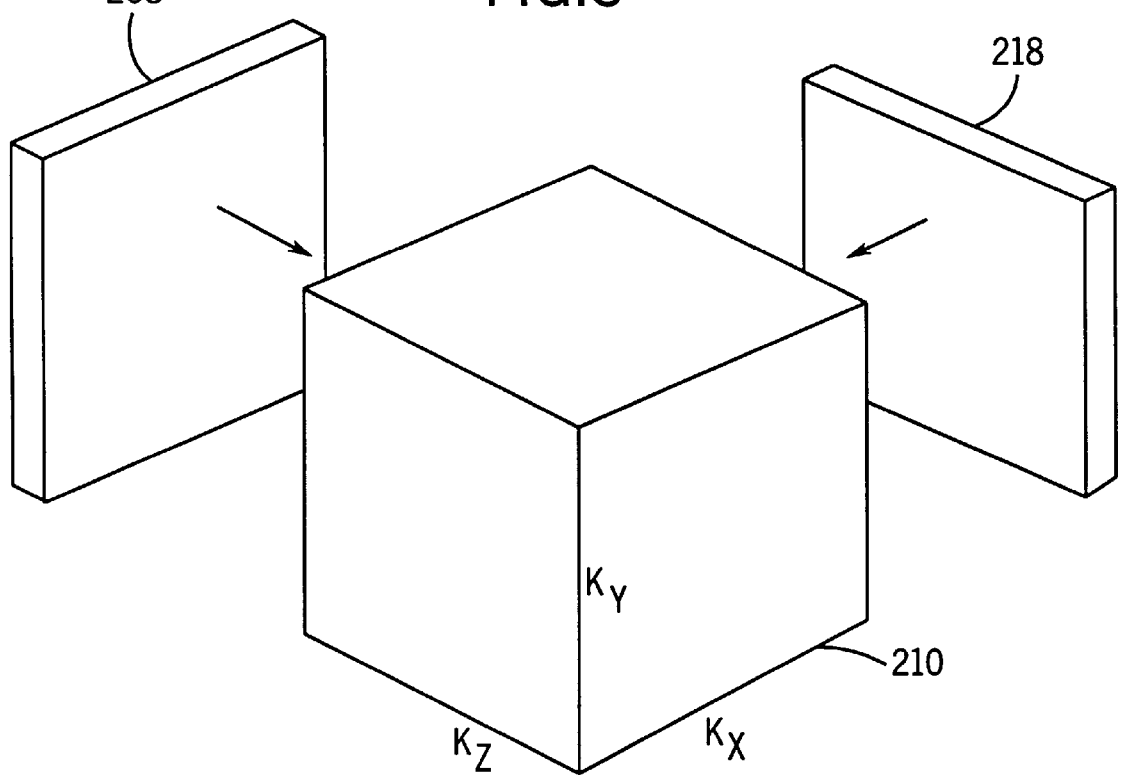
FIG. 3 is a pictorial representation of a three-dimensional data set acquired with the MRI system of FIG. 1 and processed according to a preferred embodiment of the invention.

Referring particularly to FIGS. 2 and 3, the next step indicated at process block 206 is to correct the 3D k-space data set along the $k_x$ and $k_y$ axes. As illustrated in FIG. 3, the 2D phase correction array 208 is applied to each 2D slice, or plane, disposed along the $k_z$ axis of the 3D k-space data set 210. Each phase correction in the 2D phase correction array 208 is made to the corresponding sample in each of these 2D $k_x$–$k_y$ planes to form a corrected 3D k-space data set 210.

As indicated at process blocks 212–216 the correction process is repeated along another axis. As indicated at process block 212, a copy of the corrected 3D k-space data set 210 is Fourier transformed along the $k_x$ axis and a 2D slice, or plane, of the resulting hybrid data set is selected for autocorrection. As indicated at process block 214, the selected 2D slice of $k_y$–$k_z$ data is autocorrected using the same autocorrection process described above. As shown in FIG. 3, another 2D phase correction array 218 is produced by this autocorrection process. The phase corrections in the array 218 are made to corresponding samples in each 2D slice of corrected k-space data 210 disposed along the $k_x$ axis as indicated at process block 216. As a result, a fully corrected 3D k-space data set is produced in which autocorrection has been performed along the $k_z$ and $k_x$ axes once, and along the $k_y$ axis twice.

The final step, as indicated at process block 220, is to reconstruct an 25 image from the fully corrected 3D k-space data set by performing a three-dimensional Fourier transformation thereon in the usual manner.

An alternative embodiment of the invention calculates the phase corrections in the 2D phase correction arrays 208 and 218, but does not expressly form correction arrays. As the phase corrections are produced 30 during the autocorrection process 204, they may be applied to each 2D $k_x$–$k_y$ plane of data in the hybrid 3D k-space data set. When the autocorrection process 204 is completed, the resulting corrected hybrid 3D k-space data set is inverse Fourier transformed along the $k_z$ axis to form a corrected 3D k-space data set.

The same approach may be used when performing the autocorrection at process 214. The corrections may be made directly to the hybrid 3D k-space space data set as the autocorrection process 214 is carried out. At the completion of the autocorrection process 214, therefore, the hybrid 3D k-space data set is fully corrected and a 2D Fourier transform along $k_y$ and $k_z$ is performed at process block 220 to reconstruct a 3D image.

To demonstrate autocorrection of motion within a plane, a 3D GRE acquisition (TE/TR=10/50 msec, flip angle ($\alpha$)= 90 degrees) was performed. A field of view of 20 cm, 3 mm slice thickness and resolution of 256, 128, and 64 samples along the $k_x$, $k_y$, $k_z$ spatial frequency axes respectively. The agar phantom was placed on a moveable plate and orientated at approximately 20 degrees to the physical z axis of the magnet. Axial, coronal, and sagittal 3D volumes were acquired to allow motion corruption within the $k_x$–$k_z$, $k_x$–$k_y$ and $k_y$–$k_z$ data respectively. Motion during the imaging sequence was manually imparted during data acquisition. Autocorrection was performed on hybrid image data using the three pass correction scheme described above. Autocorrection block size ranged from 64 to 1 echoes. After autocorrection, an estimate of $\Delta\phi_c$ was obtained by taking the phase difference between the original and autocorrected hybrid plane. Autocorrection of the entire data set was then accomplished by multiplying each plane of the hybrid data set and $\Delta\phi_c$.

A separate 3D GRE acquisition using the same parameters as described above was performed to obtain 3D motion. In this instance, a coronal acquisition was acquired with $k_x$, $k_y$, and $k_z$ aligned along the physical x, z and y axes of the scanner. The phantom was placed on a wedge and moved in three dimensions manually during acquisition. Motion in the $k_x$–$k_y$ plane was corrected by extracting this plane from the hybrid data set as in the case of two axis motion above. The phase map $\Delta\phi_c(i,j)$, was then applied to the hybrid data. Motion along the z axis was corrected by extracting a hybrid plane of data and estimating $\Delta\phi_c(j,k)$. The autocorrection 3D data set was obtained by applying $\Delta\phi_c(j,k)$ to the hybrid data set and Fourier transforming the data to the image domain.

Preliminary in vivo studies were performed to evaluate autocorrection in 2D and 3D GRE imaging in several anatomical regions. Fields of view, slice thickness, nutation angle $\Delta$, TE and TR were selected based on imaging protocols employed for clinical imaging. In each instance, a volunteer was asked to move during image acquisition.

In the first experiment, an axial 2D GRE of the cervical spine was obtained (TE/TE=7/425 msec, field of view=20 cm, $\Delta$=30 mm slice thickness, 256 phase encoding samples). In this instance, no through plane motion was assumed. Spatial presaturation pulses were placed superior and inferior to the imaging region. The volunteer was asked to shift during the acquisition approximately 1 cm.

Autocorrection was applied to a 3D GRE acquisition of a knee to determine the efficacy of these techniques to 3D GRE musculoskeletal imaging. An axial data set was acquired (TE/TR=7/30 msec, field of view=16 cm, $\Delta$=90 degrees, 1 mm slice thickness, and 128 and 64 phase encoding steps). The volunteer was again asked to move during the scan. Because of the articulation of the femoraltibial joint, the volunteer was asked to limit z axis motion. Because of this constraint, an axial plane approximately midway through the volume was extracted from the hybrid data set ($k_x$, $k_y$, z). Autocorrection was performed to determine $\Delta\phi_c(i,j)$ for the slice of interest.

The preliminary phantom and in vivo examples discussed above demonstrate the feasibility of autocorrection for reducing motion induced artifacts in both 2D and 3D GRE images, despite limitations inherent to GRE imaging. This technique is particularly appealing for many MR applications that employ GRE when motion is present. No special pulse sequences are required to measure motion during imaging, compared to adaptive motion correction schemes which would require three separate navigator echoes to measure motion along the three physical axes of the object. Also, this technique is independent of any scanner hardware and pulse sequence, as long as the complex image data can be saved after acquisition is complete.

When a standard imaging sequence is employed to acquire a 3D data set and the TR of the imaging sequence is sufficiently short to accommodate our assumption that $\Delta z$ is constant between phase encoding steps in $k_y$, a single k-space plane can be extracted and used to estimate the phase correction map. When motion occurs along the x-z or x-y-z axes, two orthogonal planes are required to determine the phase correction map. However, even in the case of motion along the x-y-z axes, the number of phase correction terms to be estimated is reduced by up to 95%. The heterogeneous dimensions of voxels also aid this assumption in the 3D volume. The voxel dimension is greatest along z and as a result, greater amplitude motion must exist in this dimension in order to generate the same artifact introduced along x and y. It is important to note that this assumption becomes invalid when the period of motion approaches the TR of the imaging sequence or a non standard 3D acquisition sequence is employed such as the elliptic centric phase encoding for some MR angiographic applications.

The method may also be used in other imaging modalities in which a plurality of views, or projections, are acquired over a period of time and used to reconstruct an image, such as electron beam or x-ray CT. These views, or projections can be adjusted and the result on image quality evaluated and optimized in the same manner described above for MR images.

The present invention also enables the autocorrections to be applied locally rather than globally to the entire image. Thus, local regions in the image can be separately corrected to further reduce processing time and tailor the correction to the particular motion in that region.

What is claimed is:

1. A method for autocorrecting a three-dimensional magnetic resonance data set for motion that occurs during its acquisition, the steps comprising:

Fourier transforming the three-dimensional magnetic resonance data set along a first axis to produce a first hybrid 3D data set;

extracting a two-dimensional array of data from the first hybrid 3D data set which lies in a plane perpendicular to the first axis;

producing phase corrections by performing an autocorrection process on the extracted two-dimensional array of data;

phase correcting the three-dimensional magnetic resonance data set by correcting the phase of samples in each 2D plane therein which is perpendicular to the first axis with the corresponding phase corrections; and reconstructing an image by performing a Fourier transformation on the corrected three-dimensional magnetic resonance data set.

2. The method as recited in claim 1 which includes:

Fourier transforming the corrected three-dimensional magnetic resonance data set along a second axis perpendicular to the first axis to produce a second hybrid 3D data set;

extracting a two-dimensional array of data from the second hybrid 3D data set which lies in a plane perpendicular to the second axis;

producing second phase corrections by performing an autocorrection process on the second extracted two-dimensional array of data; and phase correcting the three-dimensional magnetic resonance data set by correcting the phase of samples in each 2D plane therein which is perpendicular to the second axis with the corresponding second phase corrections.

3. The method as recited in claim 2 in which a three-dimensional Fourier transformation is performed to reconstruct a three-dimensional image.

4. The method as recited in claim 1 in which the autocorrection process provides phase corrections for subject motion along two perpendicular axes in the plane of the two-dimensional array of data.

5. The method as recited in claim 2 in which the autocorrection process provides phase corrections for subject motion along two perpendicular axes in each of the planes of the two-dimensional arrays of data.

6. The method as recited in claim 1 in which the phase corrections form a 2D phase correction array, and the three-dimensional magnetic resonance data set is corrected by correcting the phase of samples in each 2D plane therein with the corresponding phase corrections in the 2D phase correction array.

7. The method as recited in claim 1 in which the phase corrections produced during the autocorrection process are applied to corresponding locations in each two-dimensional array of data in the first hybrid 3D data set which lies in a plane perpendicular to the first axis.

8. The method as recited in claim 7 which includes:

Fourier transforming the corrected first hybrid 3D data set along the first axis to form a corrected three-dimensional k-space magnetic resonance data set;

Fourier transforming the three-dimensional k-space magnetic resonance data set along a first axis to produce a first hybrid 3D data set;

extracting a two-dimensional array of data from the first hybrid 3D data set which lies in a plane perpendicular to the first axis;

producing phase corrections by performing an autocorrection process on the extracted two-dimensional array of data;

phase correcting the three-dimensional magnetic resonance data set by correcting the phase of samples in each 2D plane therein which is perpendicular to the first axis with the corresponding phase corrections; and reconstructing an image by performing a Fourier transformation on the corrected three-dimensional magnetic resonance data set.

9. The method as recited in claim 2 in which a three-dimensional Fourier transformation is performed to reconstruct a three-dimensional image.

\* \* \* \* \*